(12) United States Patent
Hogan et al.

(10) Patent No.: US 10,923,514 B2
(45) Date of Patent: *Feb. 16, 2021

(54) ETCH CHEMISTRIES FOR METALLIZATION IN ELECTRONIC DEVICES

(71) Applicants: Patrick Hogan, Somerville, MA (US); John Moore, Camarillo, CA (US); Alex Brewer, Camarillo, CA (US); Jared Pettit, Camarillo, CA (US)

(72) Inventors: Patrick Hogan, Somerville, MA (US); John Moore, Camarillo, CA (US); Alex Brewer, Camarillo, CA (US); Jared Pettit, Camarillo, CA (US)

(73) Assignees: H.C. STARCK INC., Newton, MA (US); DAETEC. LLC, Camarillo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/217,563

(22) Filed: Dec. 12, 2018

(65) Prior Publication Data

US 2019/0148420 A1  May 16, 2019

Related U.S. Application Data

(63) Continuation of application No. 15/249,603, filed on Aug. 29, 2016, now Pat. No. 10,186,530, which is a
(Continued)

(51) Int. Cl.
*H01L 21/3205* (2006.01)
*C23F 1/16* (2006.01)
(Continued)

(52) U.S. Cl.
CPC ............ *H01L 27/1288* (2013.01); *C23F 1/02* (2013.01); *C23F 1/16* (2013.01); *C23F 1/18* (2013.01); *C23F 1/26* (2013.01); *C23F 1/30* (2013.01); *H01L 21/283* (2013.01); *H01L 21/32134* (2013.01); *H01L 21/32139* (2013.01); *H01L 27/1218* (2013.01); *H01L 27/1222* (2013.01);
(Continued)

(58) Field of Classification Search
None
See application file for complete search history.

(56) References Cited

U.S. PATENT DOCUMENTS 9,455,283 B2 * 9/2016 Hogan ................ H01L 27/1288
10,186,530 B2 * 1/2019 Hogan ................ H01L 27/1288
(Continued)

FOREIGN PATENT DOCUMENTS

WO  2010013636 A1  4/2010

OTHER PUBLICATIONS

PCT International Patent Application No. PCT/US2015/018434, International Search Report dated Jun. 15, 2015, 3 pages.

*Primary Examiner* — Daniel Whalen
(74) *Attorney, Agent, or Firm* — Morgan, Lewis & Bockius LLP

(57) ABSTRACT

In various embodiments, etchants featuring (i) mixtures of hydrochloric acid, methanesulfonic acid, and nitric acid, or (ii) mixtures of phosphoric acid, methanesulfonic acid, and nitric acid, are utilized to etch metallic bilayers while minimizing resulting etch discontinuities between the layers of the bilayer.

14 Claims, 3 Drawing Sheets

Related U.S. Application Data continuation of application No. 14/636,594, filed on Mar. 3, 2015, now Pat. No. 9,455,283.

(60) Provisional application No. 61/949,641, filed on Mar. 7, 2014.

(51) Int. Cl.
| | |
|---|---|
| *H01L 27/12* | (2006.01) |
| *C23F 1/02* | (2006.01) |
| *H01L 29/66* | (2006.01) |
| *H01L 21/283* | (2006.01) |
| *H01L 29/49* | (2006.01) |
| *H01L 29/423* | (2006.01) |
| *H01L 29/786* | (2006.01) |
| *H01L 21/3213* | (2006.01) |
| *C23F 1/18* | (2006.01) |
| *C23F 1/26* | (2006.01) |
| *C23F 1/30* | (2006.01) |
| *H01L 29/417* | (2006.01) |
| *G02F 1/1343* | (2006.01) |
| *G02F 1/1368* | (2006.01) |

(52) U.S. Cl.
CPC .... *H01L 27/1296* (2013.01); *H01L 29/41733* (2013.01); *H01L 29/42384* (2013.01); *H01L 29/4908* (2013.01); *H01L 29/4958* (2013.01); *H01L 29/66742* (2013.01); *H01L 29/66765* (2013.01); *H01L 29/78603* (2013.01); *H01L 29/78669* (2013.01); *G02F 1/1368* (2013.01); *G02F 1/13439* (2013.01); *G02F 2202/103* (2013.01)

(56) References Cited

U.S. PATENT DOCUMENTS

| | | | |
|---|---|---|---|
| 2004/0041958 A1* | 3/2004 | Hwang | G02F 1/136286 349/43 |
| 2006/0189123 A1 | 8/2006 | Saitou et al. | |
| 2009/0057668 A1 | 3/2009 | Chen et al. | |
| 2010/0051934 A1 | 3/2010 | Choung | |
| 2011/0133193 A1 | 6/2011 | Song et al. | |
| 2012/0217500 A1 | 8/2012 | Park et al. | |
| 2012/0319112 A1 | 12/2012 | Cho et al. | |
| 2013/0037798 A1 | 2/2013 | Wong et al. | |
| 2014/0024206 A1 | 1/2014 | Kim et al. | |
| 2014/0038348 A1 | 2/2014 | Kim et al. | |
| 2014/0363933 A1* | 12/2014 | Sun | H01B 1/026 438/151 |
| 2016/0372500 A1 | 12/2016 | Hogan et al. | |

\* cited by examiner

ETCH CHEMISTRIES FOR METALLIZATION IN ELECTRONIC DEVICES

RELATED APPLICATION

This application is a continuation of U.S. patent application Ser. No. 15/249,603, filed Aug. 29, 2016, which is a continuation of U.S. patent application Ser. No. 14/636,594, filed Mar. 3, 2015, which claims the benefit of and priority to U.S. Provisional Patent Application No. 61/949,641, filed Mar. 7, 2014, the entire disclosure of each of which is hereby incorporated herein by reference.

TECHNICAL FIELD

In various embodiments, the present invention relates to the metallization of electronic devices such as flat panel displays, in particular to etch chemistries utilized to process such metallization.

BACKGROUND

Flat panel displays have rapidly become ubiquitous in various markets, and are now commonly utilized in a variety of appliances, televisions, computers, cellular phones, and other electronic devices. One example of a commonly used flat panel display is the thin film transistor (TFT) liquid crystal display (LCD), or TFT-LCD. A typical TFT-LCD contains an array of TFTs each controlling the emission of light from a pixel or sub-pixel of an LCD. FIG. 1 depicts an idealized cross-section of a conventional TFT 100 as might be found in a TFT-LCD. As shown, the TFT 100 includes a gate electrode 105 formed on a glass substrate 110. A gate insulator 115 electrically insulates the gate electrode 105 from overlying conductive structures. An active layer 120, typically composed of amorphous silicon, conducts charge between a source electrode 125 and a drain electrode 130, under the electrical control of gate electrode 105, and the conducted charge controls the operation of the pixel or sub-pixel connected thereto (not shown). A source/drain insulator 132 electrically isolates the source electrode 125 from the drain electrode 130 and protectively seals the TFT 100. As shown, the gate electrode 105, source electrode 125, and drain electrode 130 each typically includes a barrier metal layer 135 and a metal conductor layer 140 thereover. The barrier 135 provides good adhesion between the conductor 140 and the underlying glass and/or silicon and reduces or prevents diffusion therebetween.

Over time, LCD panel sizes have increased and TFT-based pixel sizes have decreased, placing increasingly high demands on the conductors within the TFT-LCD structure. In order to decrease the resistance in the conductors and thereby increase electrical signal propagation speeds in the TFT-LCD, manufacturers are now utilizing low-resistivity metals such as copper (Cu) for the conductors 140 within the display. Metals such as molybdenum (Mo), titanium (Ti), or molybdenum-titanium alloys (Mo—Ti) have been utilized for barriers 135 underlying Cu conductors 140. However, particularly as feature sizes continue to shrink, the processing of such metals presents difficulties during the fabrication of the TFT-LCD. For example, as shown in FIG. 2, during the etching of electrodes such as gate electrodes 105 with conventional wet etch chemistries, either an etch residue 200 (of one or both electrode materials) or etch discontinuities 210, e.g., stepped or nonlinear profiles (caused by non-uniform etch rates of the two different electrode materials), may result.

In view of the foregoing, there is a need for improved etch chemistries usable during the processing of metal bi-layers for electronic devices such as TFT-LCDs and that enable such etching to be performed with only minimal (if any) non-uniformity in etch rate and without producing deleterious etch residue.

SUMMARY

In accordance with various embodiments of the present invention, patterned metallic structures featuring layered stacks of two or more different metallic materials (e.g., portions of TFTs for LCDs) are etched utilizing improved etchants that provide high etch selectivity between the metallic materials to be etched and any base layer or substrate (e.g., a glass or Si substrate) upon which the metallic materials are disposed. Moreover, the etch chemistries substantially nonselectively etch the various metallic materials of the structures to be etched (i.e., the metallic materials are etched at substantially the same rate), thereby minimizing or substantially eliminating any discontinuities or "steps" at the interfaces between the different metallic materials. Furthermore, the etch chemistries in accordance with embodiments of the invention etch the metallic materials while leaving little if any etch residue (e.g., residue of one or more of the metallic materials being etched) near the sidewall(s) of the etched structures; the sidewalls themselves are also substantially straight. (As used herein to apply to sidewalls, "straight" means substantially linear, and/or substantially conforming to the contour of the overlying mask material utilized to etch the patterned structures, when viewed in plan view. Straight sidewalls may be contrasted with "wavy" sidewalls that may result from undercutting or partial removal of the mask material during etching.)

In various embodiments of the present invention, the etchants include, consist essentially of, or consist of mixtures of hydrochloric acid, methanesulfonic acid, nitric acid, and, optionally, citric acid and/or a non-acid diluent. In various embodiments the diluent is water (e.g., deionized (DI) water). Furthermore, in various embodiments, the etchant contains more than 48% (e.g., at least 49%) of the diluent by weight and thus contains less than 52% acid. The etchant may even contain 50% acid, 49% acid, 45% acid, or less. Such fairly dilute etchant compositions are typically more easily handled and disposed of, and are more inexpensive due to the smaller amount of acid therewithin. In various embodiments, the etchant includes, consists essentially of, or consists of a mixture of, by weight (all percentages provided herein are by weight unless otherwise indicated), 5%-10% nitric acid, 5%-15% hydrochloric acid, and 20%-40% methanesulfonic acid, 0%-7% citric acid (or 2%-7% citric acid), and water (e.g., deionized water). In specific implementations, the etchant may include, consist essentially of, or consist of a mixture of 7% nitric acid, 9% hydrochloric acid, 33% methanesulfonic acid, and 51% water, or the etchant may include, consist essentially of, or consist of a mixture of 7% nitric acid, 12% hydrochloric acid, 30% methanesulfonic acid, and 51% water, or the etchant may include, consist essentially of, or consist of a mixture of 7% nitric acid, 12% hydrochloric acid, 25% methanesulfonic acid, and 56% water, or the etchant may include, consist essentially of, or consist of a mixture of 7% nitric acid, 5% hydrochloric acid, 37% methanesulfonic acid, and 51% water, or the etchant may include, consist essentially of, or consist of a mixture of 7% nitric acid, 12% hydrochloric acid, 30% methanesulfonic acid, 5% citric acid, and 46% water, or the etchant may include, consist essentially of, or consist of a mixture of 9% nitric acid, 12% hydrochloric acid, 30% methanesulfonic acid, and 49% water.

In other embodiments of the present invention, the etchants include, consist essentially of, or consist of mixtures of phosphoric acid, methanesulfonic acid, nitric acid, and, optionally, a non-acid diluent. In various embodiments the diluent is water (e.g., deionized (DI) water). Furthermore, in various embodiments, the etchant contains more than 15% of the diluent by weight and thus contains less than 85% acid. The etchant may even contain 80% acid or less (e.g., approximately 74%-78% acid). In various embodiments, the etchant includes, consists essentially of, or consists of a mixture of 2%-5% nitric acid, 40%-75% phosphoric acid, and 5%-30% methanesulfonic acid, and water. In specific implementations, the etchant may include, consist essentially of, or consist of 3.5% nitric acid, 60% phosphoric acid, 15% methanesulfonic acid, and 21.5% water, or the etchant may include, consist essentially of, or consist of 3.5% nitric acid, 50% phosphoric acid, 20% methanesulfonic acid, and 26.5% water, or the etchant may include, consist essentially of, or consist of 3.5% nitric acid, 68.6% phosphoric acid, 10% methanesulfonic acid, and 17.9% water.

The etchants utilized in accordance with embodiments of the present invention are particularly well suited to the etching of metallic structures including or consisting essentially of bilayers of (i) one or more refractory metals (e.g., Mo and/or tungsten (W)) or an alloy of one or more refractory metals with one or more additional metallic components and (ii) thereover, a highly conductive metal or alloy that includes, consists essentially of, or consists of, e.g., Cu, silver (Ag), gold (Au), or aluminum (Al). Such metallic bilayers may be particularly usefully employed as portions (e.g., electrodes) of TFTs, as detailed below. The additional metallic components may include such metals as tantalum (Ta), niobium (Nb), Mo, tungsten (W), zirconium (Zr), hafnium (Hf), rhenium (Re), osmium (Os), ruthenium (Ru), rhodium (Rh), Ti, vanadium (V), chromium (Cr), and/or nickel (Ni), and the additional metallic components may be present in the alloy (individually or collectively) at weight concentrations (i.e., weight %) of 1-50 percent, as described in U.S. patent application Ser. No. 14/296,796, filed on Jun. 5, 2014, and U.S. patent application Ser. No. 14/296,800, filed on Jun. 5, 2014, the entire disclosure of each of which is incorporated by reference herein. In preferred embodiments, a bilayer to be etched includes, consists essentially of, or consists of a layer of Mo and/or W topped with a layer of Cu. The multiple (e.g., two) layers of the metallic structure preferably exhibit substantially identical etch rates in the etchants described herewithin. Thus, etch-related residue and discontinuities are minimized or eliminated via use of such etchants.

In an aspect, embodiments of the invention feature a method of forming an electrode of a thin-film transistor. A base layer including, consisting essentially of, or consisting of silicon and/or glass is provided. A barrier layer is deposited over the base layer. The barrier layer includes, consists essentially of, or consists of one or more refractory metals or an alloy of one or more refractory metals with one or more additional metallic components. A conductor layer is deposited over the barrier layer. The conductor layer includes, consists essentially of, or consists of Cu, Ag, Au, and/or Al. A mask layer is formed over the barrier layer. The mask layer is patterned to reveal a portion of the conductor layer, a remaining portion of the mask layer at least partially defining a shape of the electrode. Thereafter, an etchant is applied to remove portions of the conductor layer and the barrier layer not masked by the patterned mask layer, thereby forming a sidewall of the electrode comprising (a) an exposed portion of the barrier layer, (b) an exposed portion of the conductor layer, and (c) an interface between the exposed portion of the barrier layer and the exposed portion of the conductor layer. The etchant includes, consists essentially of, or consists of (i) a mixture of hydrochloric acid, methanesulfonic acid, nitric acid, and water, or (ii) a mixture of phosphoric acid, methanesulfonic acid, nitric acid, and water.

Embodiments of the invention may include one or more of the following in any of a variety of combinations. The sidewall of the electrode may be substantially free of discontinuities notwithstanding the interface between the exposed portion of the barrier layer and the exposed portion of the conductor layer. Proximate the interface between the exposed portion of the barrier layer and the exposed portion of the conductor layer, the exposed portion of the barrier layer may protrude from the exposed portion of the conductor layer by approximately 6 μm or less. The exposed portion of the barrier layer may protrude by between approximately 1 μm and approximately 5 μm. The exposed portion of the barrier layer may protrude by between approximately 1 μm and approximately 3 μm. After the etchant is applied, the electrode may be substantially free of etch residue at (i) the interface between the exposed portion of the barrier layer and the exposed portion of the conductor layer and/or (ii) an interface between the exposed portion of the barrier layer and the base layer. The etchant may contain at least 49%, or at least 51%, water by weight. The etchant may include citric acid.

The etchant may include, consist essentially of, or consist of, by weight, 5%-10% nitric acid, 5%-15% hydrochloric acid, 20%-40% methanesulfonic acid, and 0%-7% citric acid, the balance being water. The etchant may include, consist essentially of, or consist of a mixture consisting of, by weight, 7% nitric acid, 9% hydrochloric acid, 33% methanesulfonic acid, and 51% water. The etchant may include, consist essentially of, or consist of a mixture consisting of, by weight, 7% nitric acid, 12% hydrochloric acid, 30% methanesulfonic acid, and 51% water. The etchant may include, consist essentially of, or consist of a mixture consisting of, by weight, 7% nitric acid, 12% hydrochloric acid, 25% methanesulfonic acid, and 56% water. The etchant may include, consist essentially of, or consist of a mixture consisting of, by weight, 7% nitric acid, 5% hydrochloric acid, 37% methanesulfonic acid, and 51% water. The etchant may include, consist essentially of, or consist of a mixture consisting of, by weight, 7% nitric acid, 12% hydrochloric acid, 30% methanesulfonic acid, 5% citric acid, and 46% water. The etchant may include, consist essentially of, or consist of a mixture consisting of, by weight, 9% nitric acid, 12% hydrochloric acid, 30% methanesulfonic acid, and 49% water.

The etchant may include, consist essentially of, or consist of, by weight, 2%-5% nitric acid, 40%-75% phosphoric acid, and 5%-30% methanesulfonic acid, the balance being water. The etchant may include, consist essentially of, or consist of a mixture consisting of, by weight, 3.5% nitric acid, 60% phosphoric acid, 15% methanesulfonic acid, and 21.5% water. The etchant may include, consist essentially of, or consist of a mixture consisting of, by weight, 3.5% nitric acid, 50% phosphoric acid, 20% methanesulfonic acid, and 26.5% water. The etchant may include, consist essentially of, or consist of a mixture consisting of, by weight, 3.5% nitric acid, 68.6% phosphoric acid, 10% methanesulfonic acid, and 17.9% water.

The barrier layer may include, consist essentially of, or consist of Mo, W, or an alloy of Mo and W. The barrier layer may include, consist essentially of, or consist of an alloy of Mo and/or W with one or more additional metallic components. The conductor layer may include, consist essentially of, or consist of Cu. The barrier layer may include, consist essentially of, or consist of Mo and/or the conductor layer may include, consist essentially of, or consist of Cu. The mask layer may include, consist essentially of, or consist of photoresist. The remaining portion of the patterned mask layer may be removed. The base layer may include, consist essentially of, or consist of glass. The base layer may include, consist essentially of, or consist of silicon. The base layer may include, consist essentially of, or consist of amorphous silicon.

In another aspect, embodiments of the invention feature a method of etching a metallic bilayer. A structure including, consisting essentially of, or consisting of (i) a base layer, (ii) a first metal layer disposed over the base layer, and (iii) a second metal layer disposed over the first metal layer is provided. The second metal layer is different from the first metal layer (i.e., the second metal layer includes, consists essentially of, or consists of one or more metals different from one or more metals of the first metal layer). A mask layer is formed over the second metal layer. The mask layer is patterned to reveal a portion of the second metal layer, a remaining portion of the mask layer defining a predetermined shape. Thereafter, an etchant is applied to remove portions of the second metal layer and the first metal layer not masked by the patterned mask layer, thereby forming a metallic bilayer having a sidewall comprising (a) an exposed portion of the first metal layer, (b) an exposed portion of the second metal layer, and (c) an interface between the exposed portion of the first metal layer and the exposed portion of the second metal layer. The etchant includes, consists essentially of, or consists of (i) a mixture of hydrochloric acid, methanesulfonic acid, nitric acid, and water, or (ii) a mixture of phosphoric acid, methanesulfonic acid, nitric acid, and water.

Embodiments of the invention may include one or more of the following in any of a variety of combinations. The base layer may include, consist essentially of, or consist of silicon and/or glass. The first metal layer may include, consist essentially of, or consist of one or more refractory metals or an alloy of one or more refractory metals with one or more additional metallic components. The second metal layer may include, consist essentially of, or consist of Cu, Ag, Au, and/or Al. The sidewall of the metallic bilayer may be substantially free of discontinuities notwithstanding the interface between the exposed portion of the first metal layer and the exposed portion of the second metal layer. Proximate the interface between the exposed portion of the first metal layer and the exposed portion of the second metal layer, the exposed portion of the first metal layer may protrude from the exposed portion of the second metal layer by approximately 6 μm or less. The exposed portion of the first metal layer may protrude by between approximately 1 μm and approximately 5 μm. The exposed portion of the first metal layer may protrude by between approximately 1 μm and approximately 3 μm. After the etchant is applied, the metallic bilayer may be substantially free of etch residue at (i) the interface between the exposed portion of the first metal layer and the exposed portion of the second metal layer and/or (ii) an interface between the exposed portion of the first metal layer and the base layer. The etchant may contain at least 49% water, or at least 51% water, by weight. The etchant may include citric acid.

The etchant may include, consist essentially of, or consist of, by weight, 5%-10% nitric acid, 5%-15% hydrochloric acid, 20%-40% methanesulfonic acid, and 0%-7% citric acid, the balance being water. The etchant may include, consist essentially of, or consist of a mixture consisting of, by weight, 7% nitric acid, 9% hydrochloric acid, 33% methanesulfonic acid, and 51% water. The etchant may include, consist essentially of, or consist of a mixture consisting of, by weight, 7% nitric acid, 12% hydrochloric acid, 30% methanesulfonic acid, and 51% water. The etchant may include, consist essentially of, or consist of a mixture consisting of, by weight, 7% nitric acid, 12% hydrochloric acid, 25% methanesulfonic acid, and 56% water. The etchant may include, consist essentially of, or consist of a mixture consisting of, by weight, 7% nitric acid, 5% hydrochloric acid, 37% methanesulfonic acid, and 51% water. The etchant may include, consist essentially of, or consist of a mixture consisting of, by weight, 7% nitric acid, 12% hydrochloric acid, 30% methanesulfonic acid, 5% citric acid, and 46% water. The etchant may include, consist essentially of, or consist of a mixture consisting of, by weight, 9% nitric acid, 12% hydrochloric acid, 30% methanesulfonic acid, and 49% water.

The etchant may include, consist essentially of, or consist of, by weight, 2%-5% nitric acid, 40%-75% phosphoric acid, and 5%-30% methanesulfonic acid, the balance being water. The etchant may include, consist essentially of, or consist of a mixture consisting of, by weight, 3.5% nitric acid, 60% phosphoric acid, 15% methanesulfonic acid, and 21.5% water. The etchant may include, consist essentially of, or consist of a mixture consisting of, by weight, 3.5% nitric acid, 50% phosphoric acid, 20% methanesulfonic acid, and 26.5% water. The etchant may include, consist essentially of, or consist of a mixture consisting of, by weight, 3.5% nitric acid, 68.6% phosphoric acid, 10% methanesulfonic acid, and 17.9% water.

The first metal layer may include, consist essentially of, or consist of Mo, W, or an alloy of Mo and W. The first metal layer may include, consist essentially of, or consist of an alloy of Mo and/or W with one or more additional metallic components. The second metal layer may include, consist essentially of, or consist of Cu. The first metal layer may include, consist essentially of, or consist of Mo and the second metal layer may include, consist essentially of, or consist of Cu. The mask layer may include, consist essentially of, or consist of photoresist. The remaining portion of the patterned mask layer may be removed. The base layer may include, consist essentially of, or consist of glass. The base layer may include, consist essentially of, or consist of silicon. The base layer may include, consist essentially of, or consist of amorphous silicon.

In yet another aspect, embodiments of the invention feature an etchant for substantially nonselectively etching portions of a metallic bilayer disposed over a base layer without etching the base layer. The metallic bilayer includes, consists essentially of, or consists of (i) a first metal layer and (ii) a second metal layer (a) different from the first metal layer and (b) disposed over the first metal layer. The etchant includes, consists essentially of, or consists of (i) a mixture of hydrochloric acid, methanesulfonic acid, nitric acid, and water, or (ii) a mixture of phosphoric acid, methanesulfonic acid, nitric acid, and water.

Embodiments of the invention may include one or more of the following in any of a variety of combinations. The base layer may include, consist essentially of, or consist of silicon and/or glass. The first metal layer may include, consist essentially of, or consist of one or more refractory metals or an alloy of one or more refractory metals with one or more additional metallic components. The second metal layer may include, consist essentially of, or consist of Cu, Ag, Au, and/or Al. The etchant may be configured to etch the metallic bilayer and thereby form a sidewall of the metallic bilayer that is substantially free of discontinuities notwithstanding an interface between an exposed portion of the first metal layer and an exposed portion of the second metal layer. Proximate the interface between the exposed portion of the first metal layer and the exposed portion of the second metal layer, the exposed portion of the first metal layer may protrude from the exposed portion of the second metal layer by approximately 6 µm or less. The exposed portion of the first metal layer may protrude by between approximately 1 µm and approximately 5 µm. The exposed portion of the first metal layer may protrude by between approximately 1 µm and approximately 3 µm. After the metallic bilayer is etched, the etchant may be configured to leave substantially no etch residue at (i) the interface between the exposed portion of the first metal layer and the exposed portion of the second metal layer and/or (ii) an interface between the exposed portion of the first metal layer and the base layer. The etchant may contain at least 49% water, or at least 51% water, by weight. The etchant may include citric acid.

The etchant may include, consist essentially of, or consist of, by weight, 5%-10% nitric acid, 5%-15% hydrochloric acid, 20%-40% methanesulfonic acid, and 0%-7% citric acid, the balance being water. The etchant may include, consist essentially of, or consist of a mixture consisting of, by weight, 7% nitric acid, 9% hydrochloric acid, 33% methanesulfonic acid, and 51% water. The etchant may include, consist essentially of, or consist of a mixture consisting of, by weight, 7% nitric acid, 12% hydrochloric acid, 30% methanesulfonic acid, and 51% water. The etchant may include, consist essentially of, or consist of a mixture consisting of, by weight, 7% nitric acid, 12% hydrochloric acid, 25% methanesulfonic acid, and 56% water. The etchant may include, consist essentially of, or consist of a mixture consisting of, by weight, 7% nitric acid, 5% hydrochloric acid, 37% methanesulfonic acid, and 51% water. The etchant may include, consist essentially of, or consist of a mixture consisting of, by weight, 7% nitric acid, 12% hydrochloric acid, 30% methanesulfonic acid, 5% citric acid, and 46% water. The etchant may include, consist essentially of, or consist of a mixture consisting of, by weight, 9% nitric acid, 12% hydrochloric acid, 30% methanesulfonic acid, and 49% water.

The etchant may include, consist essentially of, or consist of, by weight, 2%-5% nitric acid, 40%-75% phosphoric acid, and 5%-30% methanesulfonic acid, the balance being water. The etchant may include, consist essentially of, or consist of a mixture consisting of, by weight, 3.5% nitric acid, 60% phosphoric acid, 15% methanesulfonic acid, and 21.5% water. The etchant may include, consist essentially of, or consist of a mixture consisting of, by weight, 3.5% nitric acid, 50% phosphoric acid, 20% methanesulfonic acid, and 26.5% water. The etchant may include, consist essentially of, or consist of a mixture consisting of, by weight, 3.5% nitric acid, 68.6% phosphoric acid, 10% methanesulfonic acid, and 17.9% water.

The first metal layer may include, consist essentially of, or consist of Mo, W, or an alloy of Mo and W. The first metal layer may include, consist essentially of, or consist of an alloy of Mo and/or W with one or more additional metallic components. The second metal layer may include, consist essentially of, or consist of Cu. The first metal layer may include, consist essentially of, or consist of Mo and the second metal layer may include, consist essentially of, or consist of Cu. The etchant may be configured not to etch a mask layer applied over a portion of the second metal layer. The mask layer may include, consist essentially of, or consist of photoresist. The base layer may include, consist essentially of, or consist of glass. The base layer may include, consist essentially of, or consist of silicon. The base layer may include, consist essentially of, or consist of amorphous silicon.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean±10%, and in some embodiments, ±5%. The term "consists essentially of" means excluding other materials that contribute to function, unless otherwise defined herein. Nonetheless, such other materials may be present, collectively or individually, in trace amounts. For example, a structure consisting essentially of multiple metals will generally include only those metals and only unintentional impurities (which may be metallic or non-metallic) that may be detectable via chemical analysis but do not contribute to function. As used herein, "consisting essentially of at least one metal" refers to a metal or a mixture of two or more metals but not compounds between a metal and a non-metallic element or chemical species such as oxygen or nitrogen (e.g., metal nitrides or metal oxides); such non-metallic elements or chemical species may be present, collectively or individually, in trace amounts, e.g., as impurities. As used herein, "substrate" or "base layer" refers to a support member (e.g., a semiconductor substrate such as silicon, GaAs, GaN, SiC, sapphire, or InP, or a platform including or consisting essentially of another material, e.g., an insulating material such as glass) with or without one or more additional layers disposed thereon, or to the one or more additional layers themselves.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 3:
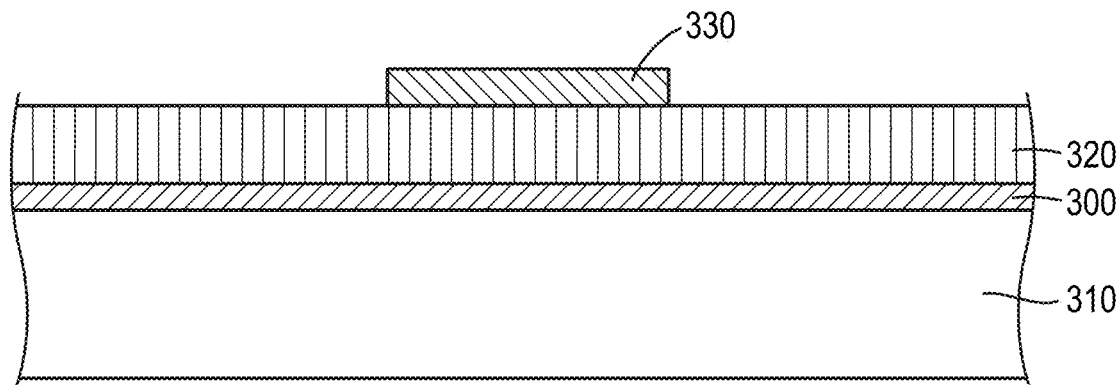
FIGS. 3 and 4 are schematic cross-sections of a TFT electrode during fabrication in accordance with various embodiments of the invention.

FIG. 3 depicts an initial step in the fabrication of a TFT gate electrode in accordance with embodiments of the present invention. As shown, a barrier layer 300 is deposited on a substrate 310 (e.g., a glass or silicon substrate) by, e.g., sputtering or other physical deposition process. A conductor layer 320 is subsequently deposited on the barrier layer 300 by, e.g., sputtering or other physical deposition process. Typically the thickness of the barrier layer 300 will be between approximately 5% and approximately 25% (e.g., approximately 10%) of the thickness of conductor layer 320. For example, the thickness of the barrier layer 300 may be approximately 50 nm, and the thickness of the conductor layer 320 may be approximately 500 nm. A mask layer 330 (e.g., photoresist) is formed over the conductor layer 320 and patterned by conventional photolithography.

Figure 4:
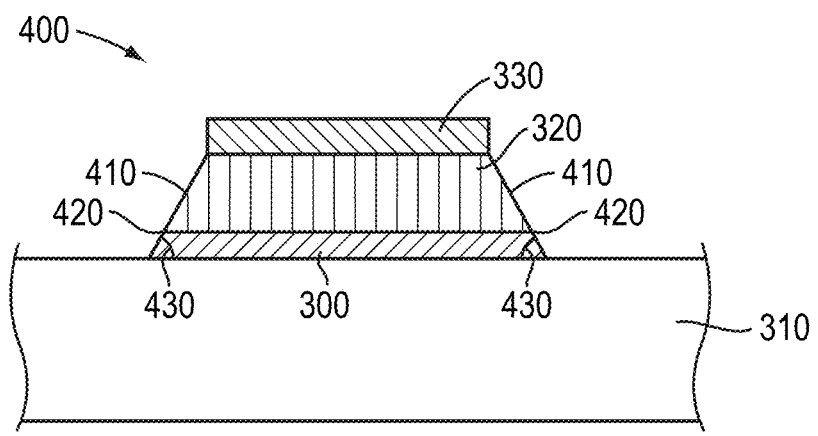

As shown in FIG. 4, an electrode 400 (e.g., a gate electrode) is then fabricated by etching the portions of the conductor layer 320 and barrier layer 300 not covered by the mask layer 330, preferably in a single-step wet etch. A wet etchant is utilized to etch away the metal layers at substantially the same rates, resulting in sidewalls 410 that are substantially smooth and/or linear and that are substantially free of any discontinuity (e.g., a stepped or nonlinear profile) at an interface 420 between the conductor layer 320 and barrier layer 300.

The wet etchant may include, consist essentially of, or consist of, for example, a mixture of hydrochloric acid, methanesulfonic acid, nitric acid, and, optionally, citric acid and/or a non-acid diluent. In various embodiments the diluent is water (e.g., deionized (DI) water). Furthermore, in various embodiments, the etchant contains more than 48% (e.g., at least 49%) of the diluent by weight and thus contains less than 52% acid. The etchant may even contain 50% acid, 49% acid, 45% acid, or less. Such fairly dilute etchant compositions are typically more easily handled and disposed of, and are more inexpensive due to the smaller amount of acid therewithin. In various embodiments, the etchant includes, consists essentially of, or consists of a mixture of, by weight (all percentages provided herein are by weight unless otherwise indicated), 5%-10% nitric acid, 5%-15% hydrochloric acid, and 20%-40% methanesulfonic acid, 0%-7% citric acid (or 2%-7% citric acid), and water (e.g., deionized water). In specific implementations, the etchant may include, consist essentially of, or consist of a mixture of 7% nitric acid, 9% hydrochloric acid, 33% methanesulfonic acid, and 51% water, or the etchant may include, consist essentially of, or consist of a mixture of 7% nitric acid, 12% hydrochloric acid, 30% methanesulfonic acid, and 51% water, or the etchant may include, consist essentially of, or consist of a mixture of 7% nitric acid, 12% hydrochloric acid, 25% methanesulfonic acid, and 56% water, or the etchant may include, consist essentially of, or consist of a mixture of 7% nitric acid, 5% hydrochloric acid, 37% methanesulfonic acid, and 51% water, or the etchant may include, consist essentially of, or consist of a mixture of 7% nitric acid, 12% hydrochloric acid, 30% methanesulfonic acid, 5% citric acid, and 46% water, or the etchant may include, consist essentially of, or consist of a mixture of 9% nitric acid, 12% hydrochloric acid, 30% methanesulfonic acid, and 49% water.

In other embodiments, the wet etchant may include, consist essentially of, or consist of a mixture of phosphoric acid, methanesulfonic acid, nitric acid, and, optionally, a non-acid diluent. In various embodiments the diluent is water (e.g., deionized (DI) water). Furthermore, in various embodiments, the etchant contains more than 15% of the diluent by weight and thus contains less than 85% acid. The etchant may even contain 80% acid or less (e.g., approximately 74%-78% acid). In various embodiments, the etchant includes, consists essentially of, or consists of a mixture of 2%-5% nitric acid, 40%-75% phosphoric acid, and 5%-30% methanesulfonic acid, and water. In specific implementations, the etchant may include, consist essentially of, or consist of 3.5% nitric acid, 60% phosphoric acid, 15% methanesulfonic acid, and 21.5% water, or the etchant may include, consist essentially of, or consist of 3.5% nitric acid, 50% phosphoric acid, 20% methanesulfonic acid, and 26.5% water, or the etchant may include, consist essentially of, or consist of 3.5% nitric acid, 68.6% phosphoric acid, 10% methanesulfonic acid, and 17.9% water.

Following the etch process, the substrate 310 (as well as the electrode 400) may be rinsed with, for example, DI water and dried (e.g., by spinning or high-velocity gas flow). After etching, the substrate 310 (as well as the electrode 400) is preferably substantially free of etch residue of one or both of the conductor layer 320 and the barrier layer 300 in regions proximate the electrode 400. In accordance with various embodiments of the invention, the wet-etching process is performed at room temperature. In other embodiments, the etchant is heated to a temperature between 40° C. and 60° C. The wet etchant may be sprayed on the substrate 310, or the substrate 310 may be partially or completely immersed in the wet etchant. The wet-etching process may be performed as a batch (i.e., multiple-substrate) process or as a single-substrate process. The etch time (i.e., the amount of time the substrate and/or layers thereover are exposed to the etchant) may be, for example, 240 seconds or less, or even 180 seconds or less, although greater times may be utilized for removal of thicker layers. In preferred embodiments, after etching the sidewalls 410 form an angle 430 with the surface of the underling substrate 310 of between approximately 50° and approximately 70°, e.g., approximately 60°. After etching, the mask layer 330 may be removed by conventional means, e.g., acetone, a commercial photoresist stripping agent, and/or exposure to an oxygen plasma.

Figure 5A:
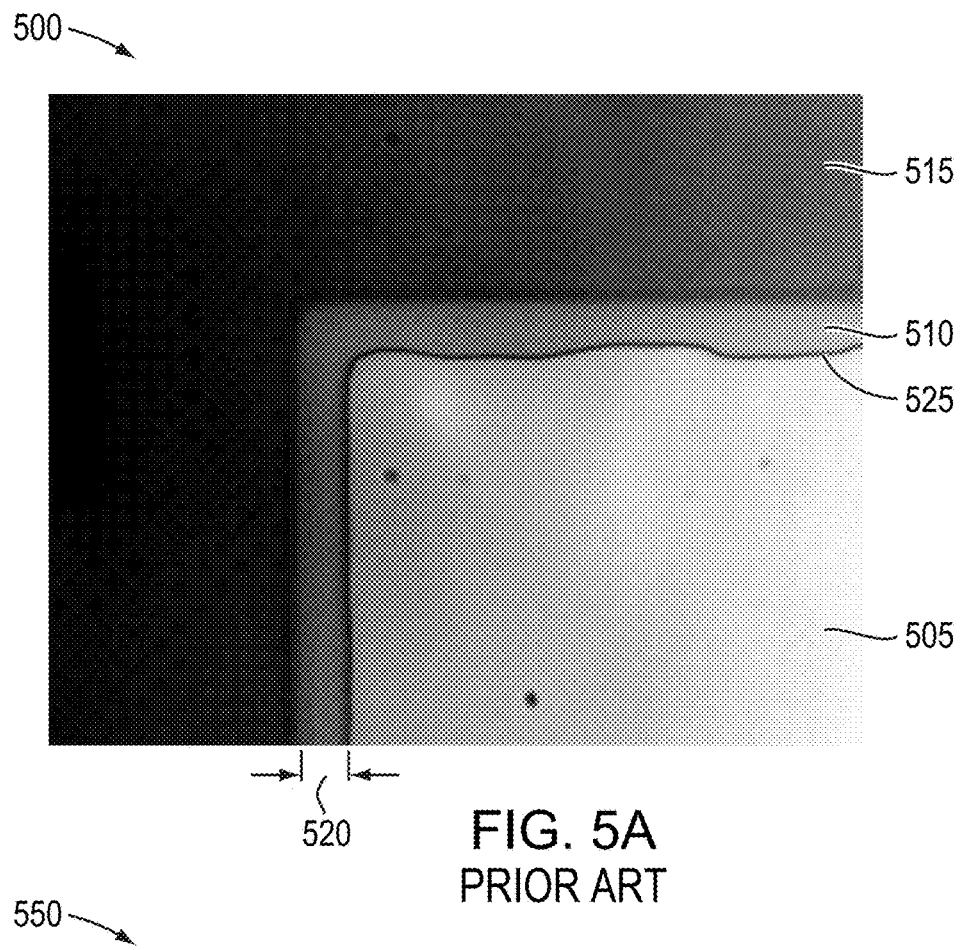
FIG. 5A is a plan-view optical micrograph of a metallic structure etched with a conventional etch chemistry.

FIG. 5A is a plan-view optical micrograph of a metallic structure 500 etched with a conventional etch chemistry, in this case a PAN etch, i.e., a mixture of phosphoric acid, acetic acid, and nitric acid. The metallic structure 500 features a 500 nm Cu layer 505 atop a 50 nm Mo layer 510, both of which are disposed on a silicon substrate 515. (Although not shown in FIG. 5A, the Cu layer 505 was masked with a layer of photoresist during etching.) As shown, the etched metallic structure 500 features a fairly large discontinuity 520 between the edges of the Cu layer 505 and the Mo layer 510. The discontinuity 520 may be, e.g., between 10 μm and 20 μm, or even larger. Moreover, the etched metallic structure 500 exhibits a fairly rough, jagged sidewall 525.

Figure 5B:
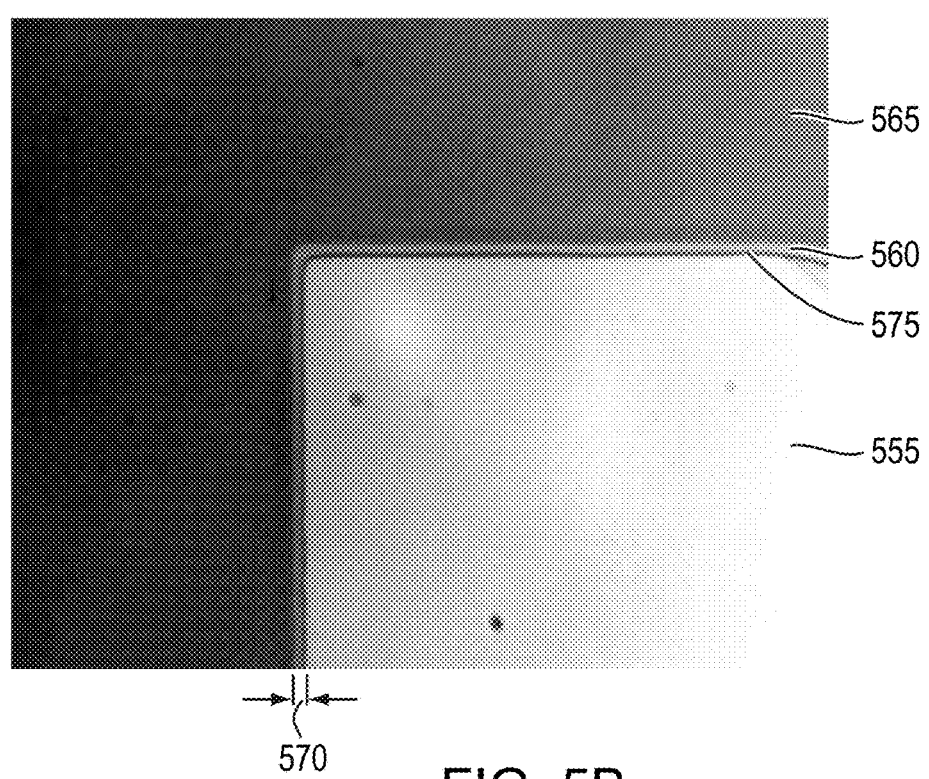
FIG. 5B is a plan-view optical micrograph of a metallic structure etched with an etch chemistry in accordance with embodiments of the invention.

FIG. 5B is a plan-view optical micrograph of a metallic structure 550 etched with an etchant in accordance with a preferred embodiment of the present invention. The metallic structure 550 features a 500 nm Cu layer 555 atop a 50 nm Mo layer 560, both of which are disposed on a silicon substrate 565. (Although not shown in FIG. 5B, the Cu layer 555 was masked with a layer of photoresist during etching.) As shown, the etched metallic structure 550 features a much smaller discontinuity 570 between the edges of the Cu layer 555 and the Mo layer 560. The discontinuity 570 may be, e.g., between 1 μm and 5 μm, between 1 μm and 3 μm, or even smaller. Furthermore, the etched metallic structure 550 exhibits a smooth and substantially straight sidewall 575. In addition, the etched metallic structure is substantially free of etch residue at the interface between the substrate 565 and the Mo layer 560, as well as at the interface between the Cu layer 555 and the Mo layer 560.

Examples

Figure 1:
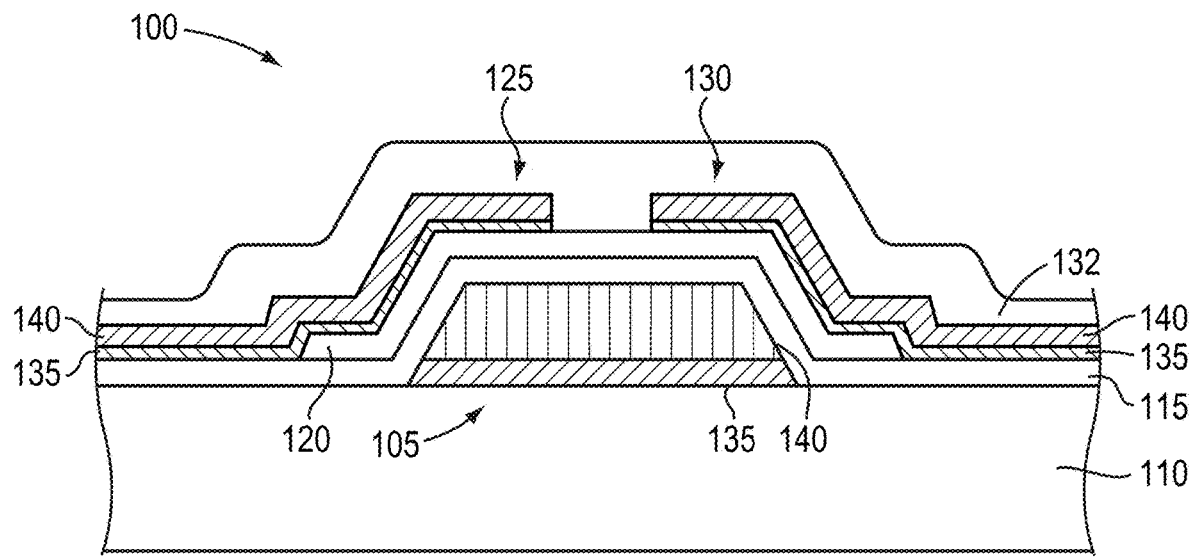
FIG. 1 is a schematic cross-section of a thin-film transistor for a liquid crystal display.
Figure 2:
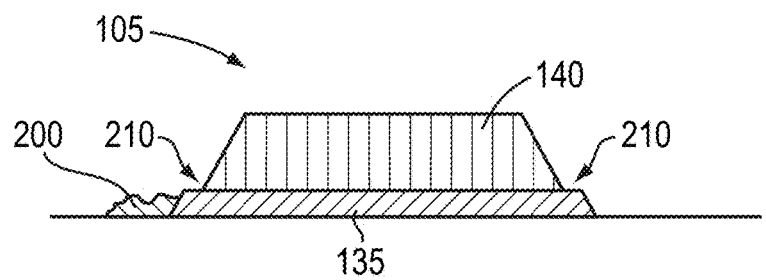
FIG. 2 is a schematic cross-section of an etched conventional TFT electrode.

A series of samples was fabricated for an etch study comparing conventional etch chemistries with etch chemistries in accordance with embodiments of the present invention. Each sample consisted of a silicon substrate, a 50 nm Mo layer disposed on the substrate, and a 500 nm Cu layer disposed on the Mo layer. Photoresist was utilized to mask a portion of the metallic structure on the substrate, much as shown in FIG. 3. As shown schematically in FIG. 4, the samples were etched until unmasked portions of the Mo and Cu layers were removed. (Due to the different amounts of acid in each etchant, the etch rates and thus the etch times for each sample generally varied.) The samples were analyzed to determine (1) the presence or absence of metal residue (as shown schematically in FIG. 2) proximate the etched structure, and (2) the step size of the etch discontinuity (if any) between the Mo and Cu layers (as shown schematically in FIG. 2). Step size was measured parallel to the plane of the substrate. The results are summarized in the table below.

| Etchant | Etch Discontinuity Size (micrometers) |
|---------|----------------------------------------|
| Control | 15 |
| 1 | 1-2 |
| 2 | 1-2 |
| 3 | 1-3 |
| 4 | 2-4 |
| 5 | 3-4 |
| 6 | 3-4 |
| 7 | 3 |
| 8 | 3-5 |
| 9 | 4-6 |

The chemistries of the various etchants utilized in the experiment were as follows, where all concentrations are by weight. First, the Control Etchant (a conventional PAN etchant) was a mixture of 50% phosphoric acid, 10% acetic acid, 5% nitric acid, and 35% water. Etchant 1 was a mixture of 7% nitric acid, 9% hydrochloric acid, 33% methanesulfonic acid, and 51% water. Etchant 2 was a mixture of 7% nitric acid, 12% hydrochloric acid, 30% methanesulfonic acid, and 51% water. Etchant 3 was a mixture of 60% phosphoric acid, 3.5% nitric acid, 15% methanesulfonic acid, and 21.5% water. Etchant 4 was a mixture of 7% nitric acid, 12% hydrochloric acid, 25% methanesulfonic acid, and 56% water. Etchant 5 was a mixture of 7% nitric acid, 5% hydrochloric acid, 37% methanesulfonic acid, and 51% water. Etchant 6 was a mixture of 7% nitric acid, 12% hydrochloric acid, 30% methanesulfonic acid, 5% citric acid, and 46% water. Etchant 7 was a mixture of 50% phosphoric acid, 3.5% nitric acid, 20% methanesulfonic acid, and 26.5% water. Etchant 8 was a mixture of 68.6% phosphoric acid, 3.5% nitric acid, 10% methanesulfonic acid, and 17.9% water. Etchant 9 was a mixture of 9% nitric acid, 12% hydrochloric acid, 30% methanesulfonic acid, and 49% water.

As the etching results demonstrate, Etchants 1-10 in accordance with embodiments of the present invention successfully etched the Mo and Cu layers with only very small resulting etch discontinuities. In comparison, the Control Etchant etched the layers while forming an etch discontinuity approximately one order of magnitude larger than the best-performing etchants in accordance with embodiments of the invention, thereby demonstrating the superiority of the etch chemistries in accordance with embodiments of the invention.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of etching a metallic bilayer, the method comprising:
   providing a structure comprising (i) a base layer, and (ii) disposed over the base layer, a bilayer comprising a first metal layer and a second metal layer, wherein the second metal layer comprises copper, and the first metal layer consists of an alloy of (a) molybdenum, (b) nickel, and (c) at least one of niobium, zirconium, hafnium, rhenium, osmium, ruthenium, rhodium, or vanadium;
   forming a mask layer over the bilayer;
   patterning the mask layer to reveal a portion of the bilayer, a remaining portion of the mask layer defining a predetermined shape; and
   thereafter, applying an etchant to remove portions of the bilayer not masked by the patterned mask layer, thereby forming a patterned feature having a sidewall comprising (a) an exposed portion of the first metal layer, (b) an exposed portion of the second metal layer, and (c) an interface between the exposed portion of the first metal layer and the exposed portion of the second metal layer.

2. The method of claim 1, wherein, within the bilayer, the first metal layer is disposed beneath the second metal layer.

3. The method of claim 1, wherein the base layer comprises at least one of silicon or glass.

4. A method of etching a metallic bilayer, the method comprising:
   providing a structure comprising (i) a base layer, and (ii) disposed over the base layer, a bilayer comprising a first metal layer and a second metal layer, wherein the first metal layer comprises an alloy of molybdenum and nickel, and the second metal layer comprises copper;
   forming a mask layer over the bilayer;
   patterning the mask layer to reveal a portion of the bilayer, a remaining portion of the mask layer defining a predetermined shape; and
   thereafter, applying an etchant to remove portions of the bilayer not masked by the patterned mask layer, thereby forming a patterned feature having a sidewall comprising (a) an exposed portion of the first metal layer, (b) an exposed portion of the second metal layer, and (c) an interface between the exposed portion of the first metal layer and the exposed portion of the second metal layer, wherein the etchant comprises a mixture of hydrochloric acid, methanesulfonic acid, nitric acid, and, optionally, citric acid and/or a non-acid diluent.

5. The method of claim 4, wherein the etchant comprises, by weight, 5%-10% nitric acid, 5%-15% hydrochloric acid, 20%-40% methanesulfonic acid, and 0%-7% citric acid, the balance being water.

6. The method of claim 4, wherein the etchant contains at least 49% diluent by weight.

7. The method of claim 4, wherein the etchant comprises 2%-7% citric acid by weight.

8. The method of claim 4, wherein, within the bilayer, the first metal layer is disposed beneath the second metal layer.

9. A method of etching a metallic bilayer, the method comprising:
provifing a structure comprising (i) a base layer, and (ii) disposed over the base layer, a bilayer comprising a first metal layer and a second metal layer, wherein the first metal layer comprises an alloy of molybdenum and nickel, and the second metal layer comprises copper;
forming a mask layer over the bilayer;
patterning the mask layer to reveal a portion of the bilayer, a remaining portion of the mask layer defining a predetermined shape; and
thereafter, applying an etchant to remove portions of the bilayer not masked by the patterned mask layer, thereby forming a patterned feature having a sidewall comprising (a) an exposed portion of the first metal layer, (b) an exposed portion of the second metal layer, and (c) an interface between the exposed portion of the first metal layer and the exposed portion of the second metal layer,
wherein the etchant consists of a mixture of hydrochloric acid, methanesulfonic acid, nitric acid, and, optionally, citric acid and/or a non-acid diluent.

10. The method of claim 9, wherein the etchant consists of, by weight, 5%-10% nitric acid, 5%-15% hydrochloric acid, 20%-40% methanesulfonic acid, and 0%-7% citric acid, the balance being water.

11. The method of claim 9, wherein, within the bilayer, the first metal layer is disposed beneath the second metal layer.

12. A method of etching a metallic bilayer, the method comprising:
providing a structure comprising (i) a base layer, and (ii) disposed over the base layer, a bilayer comprising a first metal layer and a second metal layer, wherein the first metal layer comprises an alloy of molybdenum and nickel, and the second metal layer comprises copper;
forming a mask layer over the bilayer;
patterning the mask layer to reveal a portion of the bilayer, a remaining portion of the mask layer defining a predetermined shape; and
thereafter, applying an etchant to remove portions of the bilayer not masked by the patterned mask layer, thereby forming a patterned feature having a sidewall comprising (a) an exposed portion of the first metal layer, (b) an exposed portion of the second metal layer, and (c) an interface between the exposed portion of the first metal layer and the exposed portion of the second metal layer,
wherein the etchant comprises a mixture of phosphoric acid, methanesulfonic acid, nitric acid, and, optionally, citric acid and/or a non-acid diluent.

13. The method of claim 12, wherein the etchant comprises, by weight, 40%-75% phosphoric acid, 5%-30% methanesulfonic acid, and 2%-5% nitric acid, the balance being water.

14. The method of claim 12, wherein, within the bilayer, the first metal layer is disposed beneath the second metal layer.

* * * * *